US009182465B2

(12) United States Patent
Kimmlingen et al.

(10) Patent No.: US 9,182,465 B2
(45) Date of Patent: Nov. 10, 2015

(54) MRT GRADIENT SYSTEM WITH INTEGRATED MAIN MAGNETIC FIELD GENERATION

(75) Inventors: Ralph Kimmlingen, Zirndorf (DE); Johann Schuster, Oberasbach (DE)

(73) Assignee: Siemens Aktiengesellschaft, München (DE)

( * ) Notice: Subject to any disclaimer, the term of this patent is extended or adjusted under 35 U.S.C. 154(b) by 791 days.

(21) Appl. No.: 13/411,274

(22) Filed: Mar. 2, 2012

(65) Prior Publication Data

US 2012/0249146 A1 Oct. 4, 2012

(30) Foreign Application Priority Data

Mar. 4, 2011 (DE) .......................... 10 2011 005 146

(51) Int. Cl.
*G01R 33/385* (2006.01)
*G01R 33/381* (2006.01)
*G01R 33/3873* (2006.01)

(52) U.S. Cl.
CPC ............ *G01R 33/385* (2013.01); *G01R 33/381* (2013.01); *G01R 33/3873* (2013.01)

(58) Field of Classification Search
CPC . G01R 33/385; G01R 33/381; G01R 33/3873
See application file for complete search history.

(56) References Cited

U.S. PATENT DOCUMENTS

| 5,378,989 A * | 1/1995 | Barber et al. ............... 324/318 |
| 5,539,367 A * | 7/1996 | Xu et al. .................... 335/301 |
| 5,545,996 A * | 8/1996 | Morich et al. ............... 324/318 |
| 6,680,612 B1 * | 1/2004 | McKinnon et al. ............ 324/318 |
| 7,193,417 B2 * | 3/2007 | Forbes et al. ................ 324/318 |
| 7,276,906 B2 * | 10/2007 | Shvartsman et al. ......... 324/318 |
| 7,565,189 B2 * | 7/2009 | Mansfield et al. ............ 600/410 |
| 7,852,083 B2 * | 12/2010 | Yatsuo et al. ................ 324/318 |
| 7,932,722 B2 * | 4/2011 | Amm et al. .................. 324/318 |
| 8,587,313 B2 * | 11/2013 | Imamura et al. ............. 324/318 |
| 2010/0308822 A1 | 12/2010 | Prado et al. |

FOREIGN PATENT DOCUMENTS

| DE | 40 11 660 A1 | 10/1991 |
| DE | 199 55 117 A1 | 5/2001 |
| DE | 100 10 421 A1 | 10/2001 |
| DE | 102 09 089 A1 | 9/2003 |
| DE | 103 14 215 B4 | 11/2006 |
| DE | 10 2007 047 023 A1 | 1/2009 |
| DE | 10 2008 018 265 A1 | 10/2009 |

OTHER PUBLICATIONS

German Office Action dated Sep. 29, 2011 for corresponding German Patent Application No. DE 10 2011 005 146.5 with English translation.

* cited by examiner

*Primary Examiner* — Dixomara Vargas

(74) *Attorney, Agent, or Firm* — Lempia Summerfield Katz LLC

(57) ABSTRACT

In one embodiment, a magnetic resonance tomography system that has a gradient field coil system for generating a gradient field is provided. The gradient field coil system is also a main magnetic field generation system for generating a main field.

20 Claims, 4 Drawing Sheets

MRT GRADIENT SYSTEM WITH INTEGRATED MAIN MAGNETIC FIELD GENERATION

This application claims the benefit of DE 10 2011 005 146.5, filed on Mar. 4, 2011.

BACKGROUND

The present embodiments relate to an MRT system and a method.

Magnetic resonance tomography devices for examining objects or patients, using magnetic resonance tomography (MRT, MRI) are known, for example, from DE10314215B4.

SUMMARY

The present embodiments may obviate one or more of the drawbacks or limitations in the related art. For example, an MRT system may be optimized.

An embodiment includes generating a main field B0 using a gradient field coil system that may also be used to generate a gradient field $B_G$.

DETAILED DESCRIPTION OF THE DRAWINGS

Figure 3:
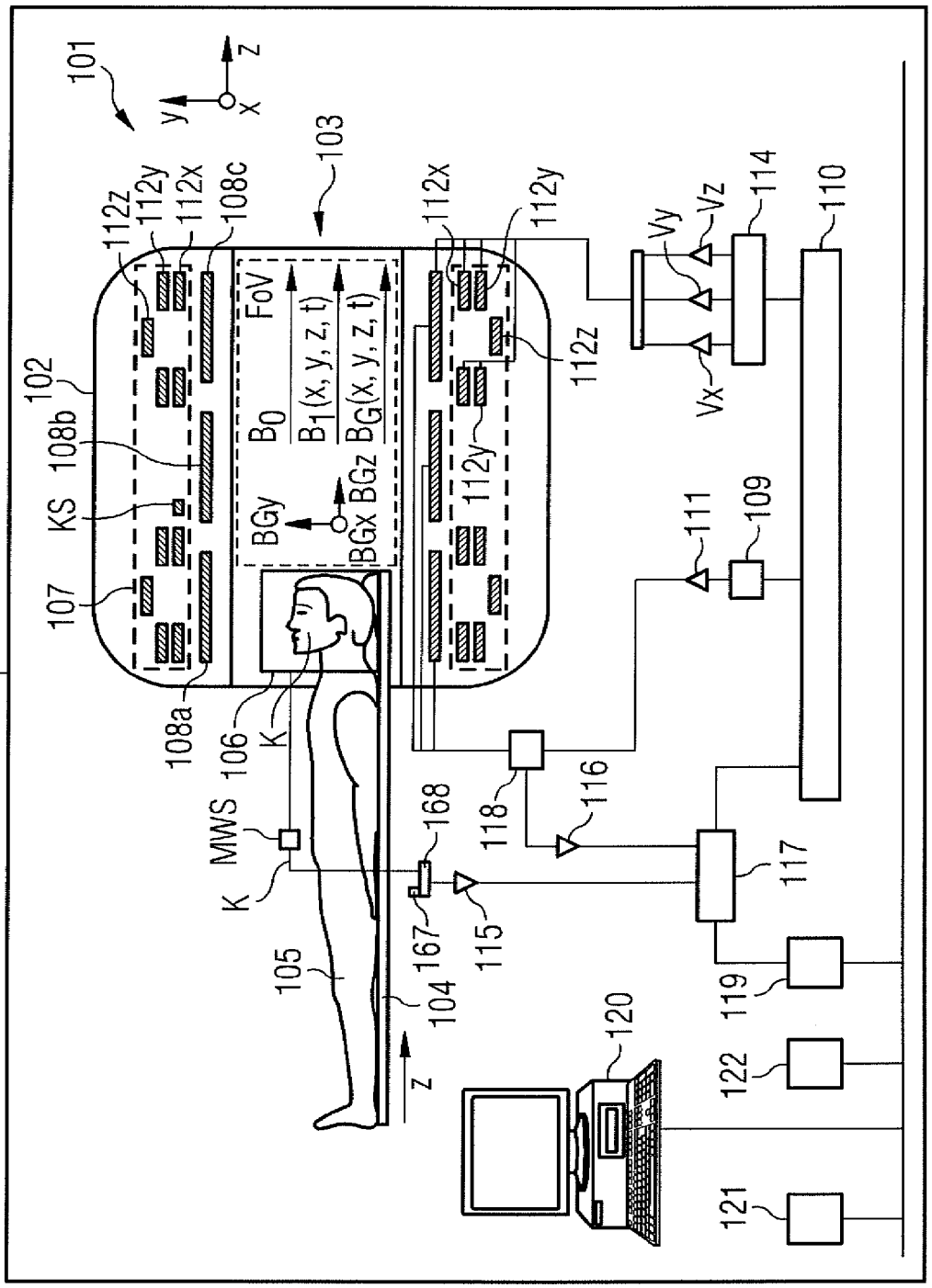
FIG. 3 shows an MRT system in a simplified schematic view.

FIG. 3 shows an imaging magnetic resonance device MRT 101 (e.g., contained in a shielded room or Faraday cage F) including a whole-body coil 102 having a, for example, tubular bore 103. A patient couch 104 bearing a body 105 (e.g., of an examination object such as a patient; with or without a local coil arrangement 106) may be introduced into the tubular bore 103 in a direction of the arrow z so that images of the patient 105 may be generated using an imaging method. Disposed on the patient 105, for example, is the local coil arrangement 106, using which images may be generated in a local area (e.g., a field of view or FOV). Signals of the local coil arrangement 106 may be evaluated (e.g., converted into images, stored or displayed) by an evaluation apparatus (e.g., including elements 115, 117, 119, 120, 121, etc.) of the MRT 101 that may be connected to the local coil arrangement 106, for example, by a local coil connecting lead (e.g., a coaxial cable K or wirelessly (elements 167, 168)).

When the magnetic resonance device MRT 101 is used in order to examine the body 105 (e.g., the examination object or the patient) using magnetic resonance imaging, different magnetic fields that are coordinated with one another with precision in terms of temporal and spatial characteristics are radiated onto the body 105. A strong magnet (e.g., a cryomagnet 107) in a measurement chamber having, for example, the tunnel-shaped bore 103 generates a strong static main magnetic field $B_0$ ranging, for example, from 0.2 Tesla to 3 Tesla or more. The body 105 that is to be examined, supported on a patient couch 104, is moved into a region of the main magnetic field $B_0$. The main magnetic field $B_0$ is approximately homogeneous in an area of observation FoV (Field of View). The nuclear spins of atomic nuclei of the body 105 are excited by way of magnetic radio-frequency excitation pulses $B1(x, y, z, t)$ that are emitted via a radio-frequency antenna (and/or a local coil arrangement if necessary) that is depicted in FIG. 3 in simplified form as a body coil 108 (e.g., a multipart body coil 108a, 108b, 108c). Radio-frequency excitation pulses are generated, for example, by a pulse generation unit 109 that is controlled by a pulse sequence control unit 110. Following amplification by a radio-frequency amplifier 111, the pulses are directed to the radio-frequency antenna 108. The radio-frequency system shown in FIG. 3 is indicated only schematically. Often more than one pulse generation unit 109, more than one radio-frequency amplifier 111 and a plurality of radio-frequency antennas 108 a, b, c are used in a magnetic resonance device 101.

The magnetic resonance device 101 also includes gradient coils 112x, 112y, 112z, using which magnetic gradient fields are radiated in the course of a measurement in order to provide selective layer excitation and for spatial encoding of the measurement signal. The gradient coils 112x, 112y, 112z are controlled by a gradient coil control unit 114 that, like the pulse generation unit 109, is connected to the pulse sequence control unit 110.

Signals transmitted by the excited nuclear spins (the atomic nuclei in the examination object) are received by the body coil 108 and/or at least one local coil arrangement 106, amplified by associated radio-frequency preamplifiers 116, and processed further and digitized by a receiving unit 117. The recorded measurement data is digitized and stored in the form of complex numeric values in a k-space matrix. An associated MR image may be reconstructed from the value-filled k-space matrix using a multidimensional Fourier transform.

In the case of a coil that may be operated in both the transmit and the receive mode (e.g., the body coil 108 or a local coil 106), correct signal forwarding is controlled by an upstream-connected duplexer 118.

From the measurement data, an image processing unit 119 generates an image that is displayed to a user via an operator console 120 and/or stored in a memory unit 121. A central computer unit 122 controls the individual system components.

In MR tomography, images having a high signal-to-noise ratio (SNR) may be acquired using local coil arrangements (e.g., loops, local coils). These are antenna systems that are mounted in immediate proximity to (on (anterior), under (posterior) or in) the body. In the course of an MR measurement, the excited nuclei induce a voltage in the individual antennas of the local coil. The induced voltage is amplified by a low-noise preamplifier (e.g., LNA, preamp) and forwarded to the receive electronics. High-field systems (e.g., 1.5 T and more) are employed even in the case of high-resolution images in order to improve the signal-to-noise ratio. If more individual antennas may be connected to an MR receiving system than there are receivers present, a switching array (RCCS)) is installed between receive antennas and receivers. The array routes the currently active receive channels (e.g., the receive channels currently lying in the field of view of the magnet) to the receivers present. This enables more coil elements to be connected than there are receivers available, since, in the case of whole-body coverage, only the coils that are located in the field of view FoV or in the homogeneity volume of the magnet may be read out.

The local coil arrangement 106 serves to denote, for example, an antenna system that may include, for example, one antenna element or of a plurality of antenna elements (e.g., coil elements) embodied as an array coil. The individual antenna elements are implemented, for example, as loop antennas (e.g., loops) or as butterfly or saddle coils. The local coil arrangement includes, for example, coil elements, a preamplifier, further electronics (e.g., standing wave traps, etc.), a housing, supports, and a cable with a plug, using which the coil arrangement is connected to the MRT system. A receiver 168 mounted on the system side filters and digitizes a signal received, for example, wirelessly by the local coil 106 and passes the data to a digital signal processing device that may derive an image or a spectrum from the data acquired using a measurement. The receiver 168 makes the image or the spectrum available to the user, for example, for subsequent diagnosis by the user and/or for storage in a memory.

Possible details of exemplary embodiments of MRTs and methods according to the present embodiments are described in greater detail below.

Magnetic resonance tomography (MRT, MRI) is based on the excitation of the nuclear spins of suitable atoms or molecules in an examination object. A strong, directed main magnetic field B0 is used for this purpose.

The magnetic field influences the distribution numbers of the excitation states (e.g., spins parallel/anti-parallel to the field direction) such that a slight preference for one (e.g., the parallel) state is produced. The distribution number difference and hence the magnitude of the usable macroscopic magnetization M0 is directly dependent on, for example, the magnetic field strength and the tissue temperature of the subject being examined. The relaxation times T1, T2, T2* responsible for the contrasts in the image change with the magnitude of the main magnetic field strength.

The main magnetic field in MR procedures is generated, for example, by large-scale magnets with supraconducting windings. Alternatively, in the low-field systems sector, heavyweight permanent magnets and electromagnets with iron yoke are used. A common feature of all the magnetic systems is the constancy over time of the magnetic field. A main magnetic field strength of, for example, 1.5 T may be used.

Research equipment with a small useful volume designed specifically for this purpose permits the field strength of the main field magnet to be changed quickly in the low-field regime (e.g., 0-500 mT, field cycling). For this purpose, the current in the electromagnet generating the main field is varied over time. Known applications are diffusometry (e.g., characterization of diffusion properties) and relaxometry (e.g., characterization of the change in the contrast-creating relaxation times T1, T2, T2*). Also possible are methods that perform the RF excitation of the nuclear spins at high main field strength, and the subsequent k-space encoding and data acquisition at low main field strength. Advantageous aspects are the increase in the magnetization M0 and the long T2 time. A problem with the method lies in the eddy currents induced when the main field is changed, since the unshielded magnetic field coils may be operated in an environment in which efficiently conducting surfaces (e.g., cryostats) are present. No corresponding method is known in the prior art in the whole-body tomography field.

A method for designing and operating a gradient field coil with integrated main magnetic field generation is described in the present embodiments.

The field generation takes place, for example, with the aid of a zoomable gradient system, as described, by way of example, in DE 19955117 C2, which is hereby incorporated by reference.

Figure 4:
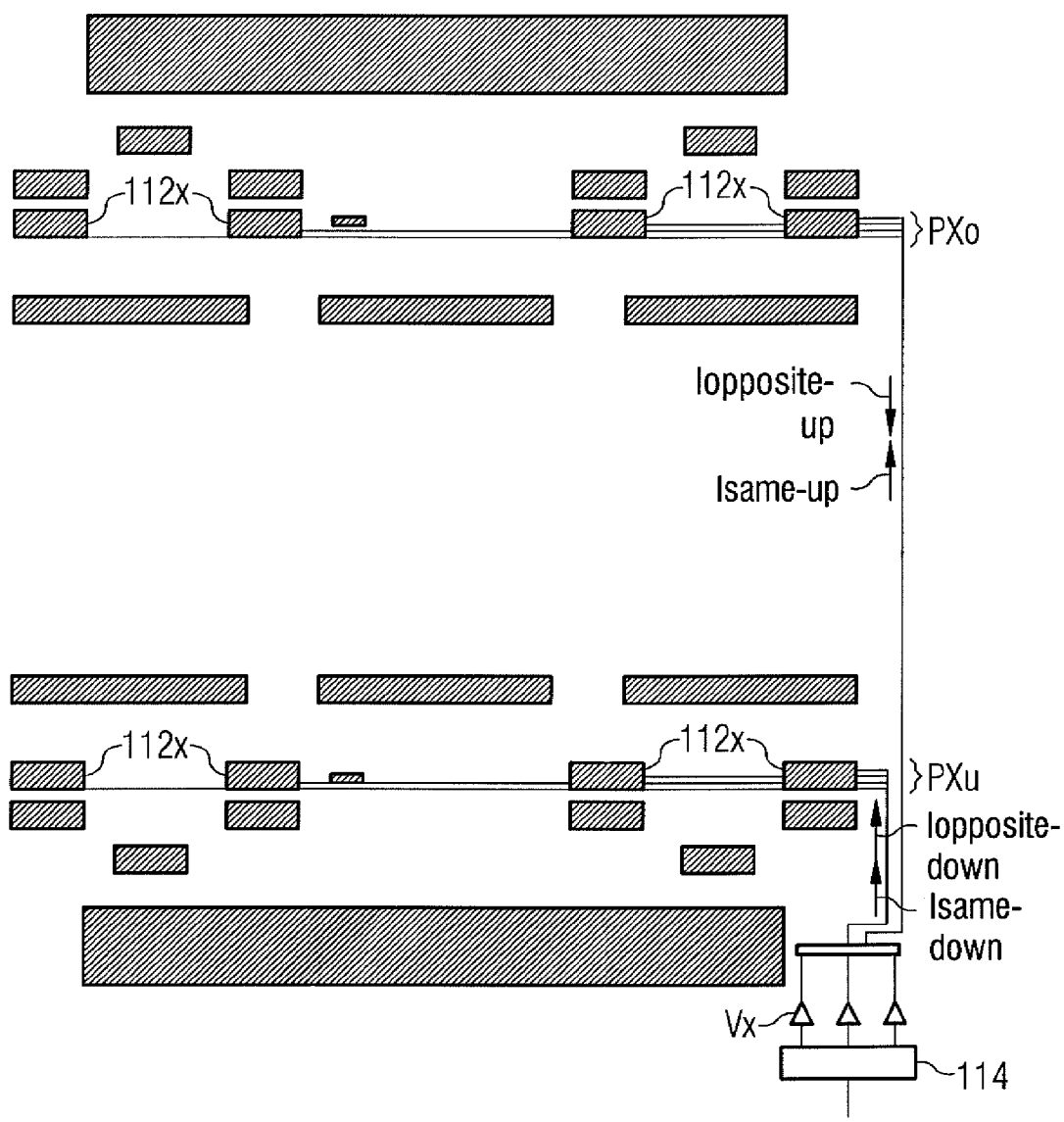
FIG. 4 shows in a simplified schematic diagram, with details extracted from FIG. 3, currents applied in one embodiment of a device for generating a field in the direction of at least an x axis of an MRT system.

FIG. 4 shows, as a detail in simplified schematic form, currents in a device for generating a magnetic field gradient (e.g., $B_G$ field) in the direction of a gradient system x-axis of an MRT system.

In one embodiment (as in FIGS. 3, 4), at least one field-generating axis 112x of the gradient system is divided into two independently controllable coil system parts PXo, PXu (e.g., halves; on opposite sides of an FoV) that together, suitably connected, generate a magnetic field gradient $B_G$ in one (x) of the three directions or axes x, y, z.

In order to generate a magnetic field gradient $B_G$ in one (x) of the three directions or axes x, y, z, current is applied in opposite directions to two suitable conductor stacks PXo, PXu (e.g., using $I_{opposite-up}$, $I_{opposite-down}$). In other words, current flows through the two suitable conductor stacks PXo, PXu in one direction, which generates a field of approximately the same direction in both conductor stacks, with the result that the two thus generated partial fields additively overlay each other.

In order to generate a magnetic field (B0) of maximum strength in the imaging volume FoV, the two conductor stacks PXo, PXu (e.g., located on opposite sides of the FoV) of a gradient system part 112x (or 112y or 112z) have current applied to the two conductor stacks PXo, PXu in the same direction ($I_{same-up}$, $I_{same-down}$).

In a zoomcoil system, the two (cited) field characteristics may be generated simultaneously and independently of each other by superposition of the currents directed with respect to the generated field in the same direction (e.g., generating one field in the same direction) and in the opposite direction (e.g., generating partial fields in opposite directions).

Thus, currents $I_{same-up}$, $I_{same-down}$ generating a field in the same direction (e.g., for an additively superposed main field B0 for one field direction x, y and/or z) in the two conductor stacks PXo, PXu of a gradient system part 112x (or also 112y and/or 112z) are additively (summated) overlaid by currents $I_{opposite-up}$, $I_{opposite-down}$, generating a field in opposite directions (e.g., for a gradient field $B_G(x)$ formed as a difference of oppositely acting currents for one field direction x (or y or z)).

The superposed currents $I_{same-up}$, $I_{same-down}$ and $I_{opposite-up}$, $I_{opposite-down}$ may be applied to the conductor stacks PXo, PXu for a gradient field in, for example, the x-direction of a gradient system part for a gradient field axis x (or y or z).

The resulting field (B0 fraction for one direction x, y, z in each case) of same-direction current injection (e.g., $I_{same-up}$, $I_{same-down}$) of the stacks 112x, 112y, 112z (e.g., for one direction x,y,z in each case) exhibits a constant characteristic (e.g., field profile) in the imaging volume FoV (e.g., as B0 term) instead of a gradient-like characteristic (e.g., linear term). This field may not be optimal, as yet, for normal MR imaging due to the strong (e.g., >10%) second- and higher-order noise terms. This may be illustrated using the example of the bandwidth that would then be required for an RF pulse: at a noise term amplitude of 10% (e.g., 100 mT in the case of a main field of 1 T), a bandwidth of ~42 MHz/T (e.g., 4.2 MHz) is to be generated for proton excitation (e.g., excitation of HI nuclei in the examination object). In the simplest case, this corresponds to a square-wave pulse with 240 ns top length. Typical (short) RF pulses in MR are longer by a factor 10.

According to an embodiment, a calculation and optimization method that simultaneously takes into account parameters in relation to field gradient specifications of each individual axis and parameters in relation to a homogeneity for the superposition of all available sub-coils is provided. A useful subdivision for the transverse gradient axes is, for example, the subdivision into four shielded saddle coils. Since sign and amplitude of the field of each sub-coil are freely selectable, selected higher-order noise terms may be compensated. A homogeneity specification that fulfills many requirements may thus be achieved in a small volume. For the larger homogeneity volume in whole-body imaging, more degrees of freedom are advantageous for the optimization method. These may be provided in the form of a further sub-coil serving exclusively to improve the homogeneity specification.

An error on the order of magnitude of 0.1% per development term is anticipated due to the unavoidable dimensional tolerances in gradient coils. However, the homogeneity specification demands much higher degrees of precision. For example, the noise terms are to be <0.01% (e.g., one order of magnitude less).

This problem may be reduced by determining the precise values of the coefficients using a field measurement following the installation of the coil. From these, correction scaling factors for the current amplitudes of each sub-coil amplifier system may be taken into account.

For example, the scaling factors may be optimized such that the sum total of error contributions of all of the sub-coils is reduced to a minimum.

The remaining $B0$ field errors may be eliminated, for example, using techniques such as, for example, higher order passive iron shim and electric correction coils. Electrical shims of 1st-3rd order at room temperature are employed both in the clinical and in the research domain. Even with field contributions in the region of 0.1% of the main magnetic field, no significant field instabilities that may be caused by the operation of the gradient axes inside the same coil carrier are known.

A problem with the use of iron shims may be shim drift. Changes in temperature and location (e.g., due to heating and expansion of the gradient coil) alter the magnetization of the shim iron. In a gradient/$B0$ system without an additional main field magnet, this effect may be minimized by mounting the shim iron on a carrier structure outside of the gradient coil. An insulation gap is provided, for example, between gradient coil and structure. Decoupling measures for radiant heat and stray fields may be implemented in this area. One simple measure is a reflective and highly conductive layer made of copper sheet. This deflects radiant heat and reduces the eddy field heating of the shim iron at high frequencies. Residual effects may be eliminated, for example, by an electrical regulation of the shim iron temperature (see, for example, DE10209089A1, which is hereby incorporated by reference). Any residual effects of electric shim coils may be eliminated by mounting the coils on the carrier structure.

The resulting gradient field/main magnetic field system may advantageously be operated in various ways: a) actively shielded gradient field and main magnetic field within a strong main field magnet (e.g., applicable, for example, in diffusometry, relaxometry); b) unshielded gradient field and main magnetic field without ancillary magnet (hence, approximately a factor of 2 stronger) (e.g., applicable in the low-field system (excitation of MO at approximately 0.2 T) for low-end MR imaging, diffusometry, relaxometry); and c) unshielded gradient field and main magnetic field of a multi-layer gradient field coil without ancillary magnet (e.g., applicable as a standard system (excitation of MO at approximately 1.0 T) for normal MR imaging, diffusometry, relaxometry).

Scenario a) is an application in the context of the field-cycling, in which the inhomogeneous magnetic field is used to increase the magnetic field strength of already existing homogeneous main field.

By way of example, an approximately 100 mT increase in field strength at a current intensity of 900 A may be achieved in the case of a gradient coil (GC) internal diameter of 61 cm in a 1.5 T magnet with 90 cm internal diameter by superposing three dual-layer, actively shielded gradient axes. Since the increased magnetization $M0^*$ develops with the time constant $T1$, the dimensioning of the current source to top times in the region of 100 ms or more is used.

In scenarios b) and c), additional shielding measures may be provided for the pulsed magnetic field inside the RF chamber. An advantageous variant of the external shielding consists in mounting electrically highly conductive panels in a suitably distributed arrangement on the walls of the RF chamber F. The pulsed $B0$ field then induces eddy currents in the distributed panel arrangement. The eddy currents attenuate the stray field amplitude outside the RF chamber. The distribution of the panels is calculated to provide that the amplitude of the magnetic stray fields outside the RF chamber F is limited to a defined value in the relevant frequency spectrum.

The present embodiments also include a method for designing and operating a gradient field coil with integrated main magnetic field generation.

Advantages may be, for example, that specialized MR methods (e.g., diffusometry, relaxometry) are possible in the whole-body system, that MRT imaging may also be carried out without additional main field magnet just with the gradient system, and that a main field magnet may be omitted (in which case, the gradient system may become considerably more expensive).

Figure 1:
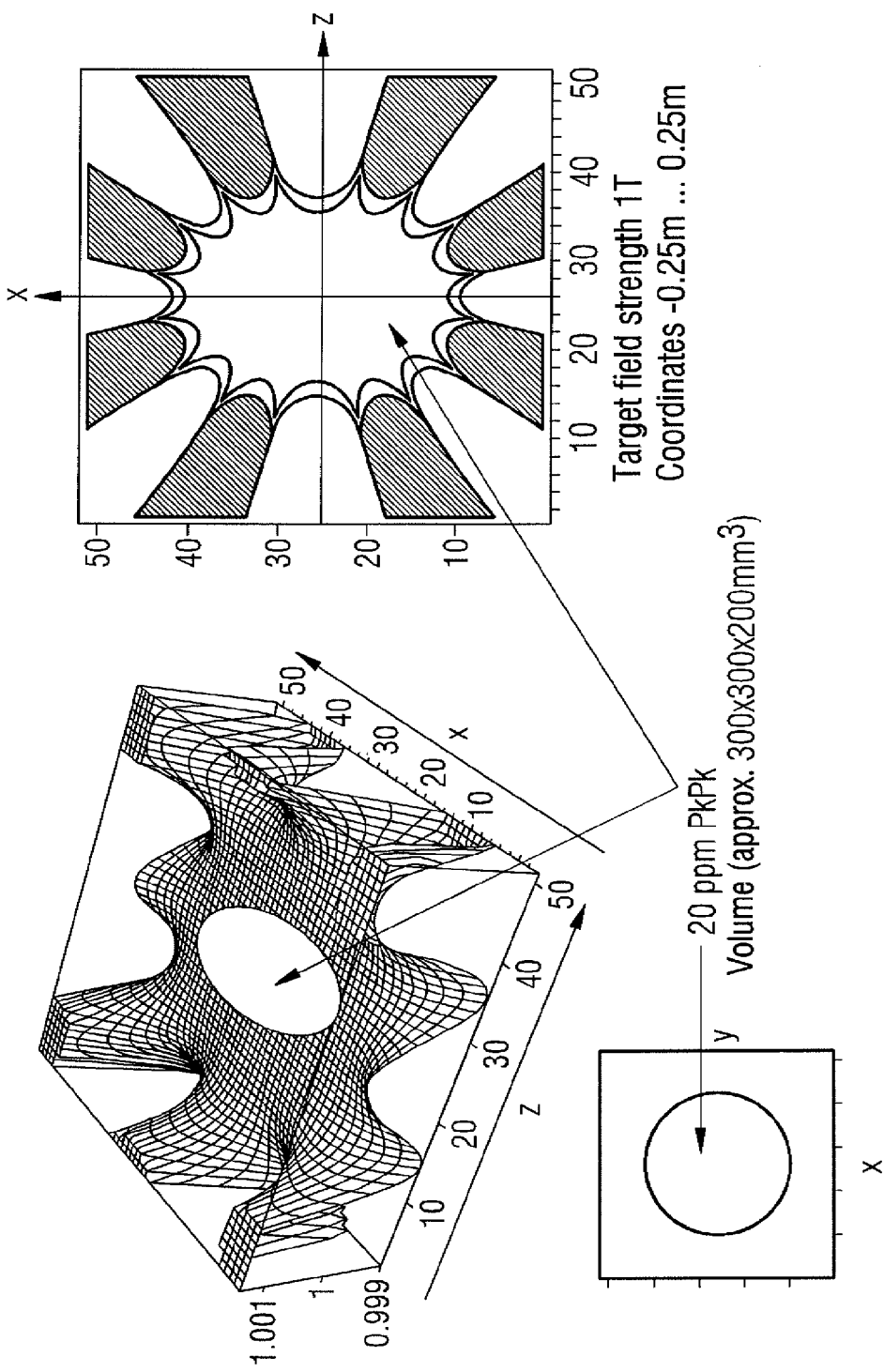
FIG. 1 shows an exemplary magnetic field plot (z-component) of B0 modes of an MRT, generated by three combined gradient axes with a correction coil.
Figure 2:
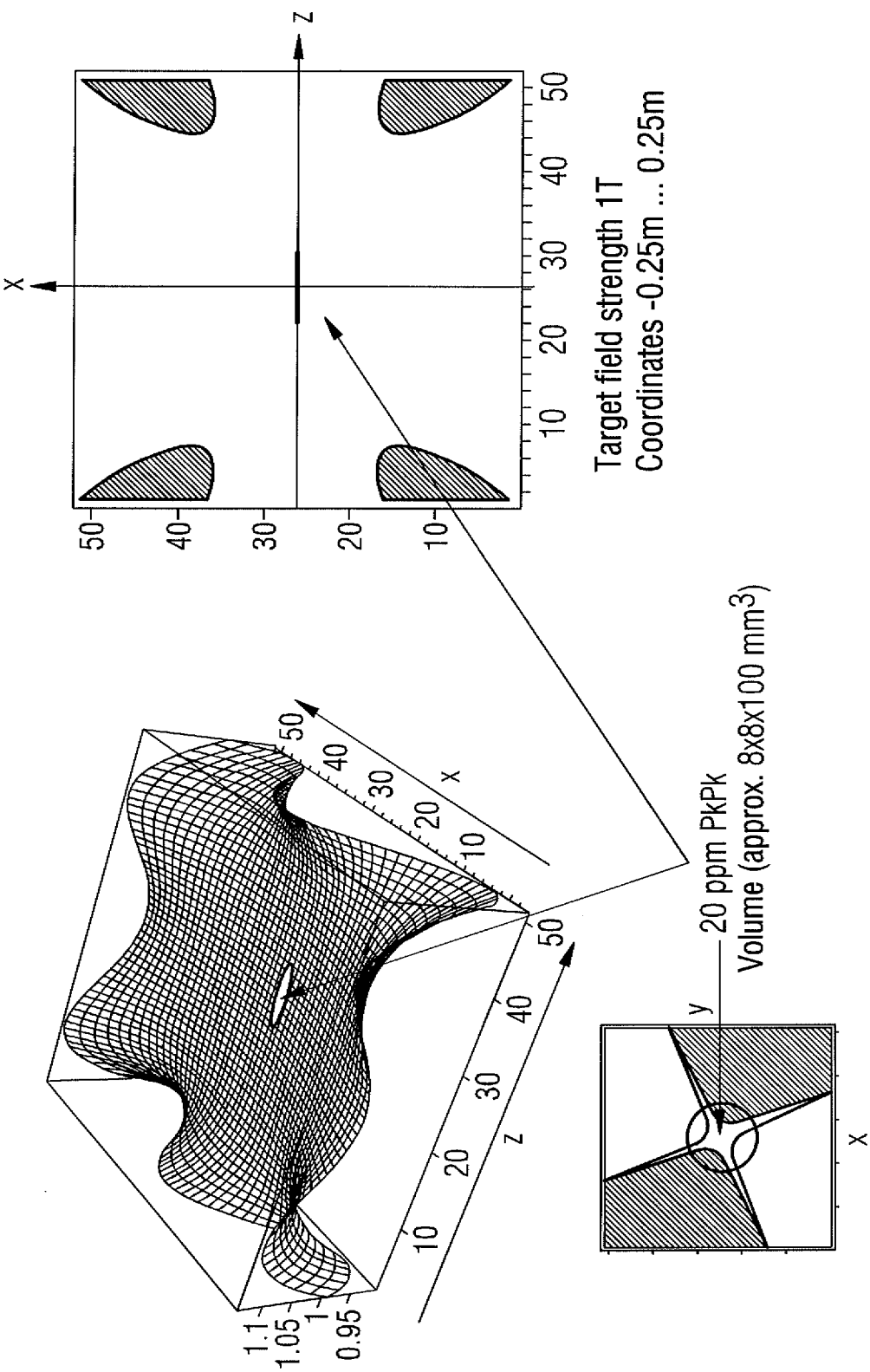
FIG. 2 shows a exemplary magnetic field plot (z-component) of the B0 modes of an MRT generated by three combined gradient axes (uncorrected)

FIG. 1 and FIG. 2 show, by way of example, a magnetic field plot (z-component) of the $B0$ modes of an MRT, and a magnetic field plot (z-component) of the $B0$ modes of an MRT generated by three combined gradient axes (uncorrected).

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography system comprising:
a gradient field coil system operable to generate a gradient field, the gradient field coil system also being a main magnetic field generation system operable to generate a main field,
wherein the gradient field coil system for generating the main field comprises at least one device, each device operable to generate one field in a direction of one gradient system axis, and
wherein each device comprises two independently controllable gradient system axes halves, the two gradient system axes halves operable to have current applied to the two gradient system axes halves, such that the gradient field is generated in opposite directions, the two gradient system axes halves also operable to have current applied to the two gradient system axes halves, such that the main magnetic field is generated in an imaging volume of the magnetic resonance tomography in the same direction.

2. The magnetic resonance tomography system as claimed in claim 1, further comprising an additional main field magnet.

3. The magnetic resonance tomography system as claimed in claim 1, wherein the magnetic resonance tomography system does not include an additional main field magnet.

4. The magnetic resonance tomography system as claimed in claim 1, wherein the gradient field coil system for generating the main field comprises three devices.

5. The magnetic resonance tomography system as claimed in claim 4, wherein each device of the three devices is operable to generate a respective field with one correction coil, with one correction coil for the three devices, or without a correction coil.

6. The magnetic resonance tomography system as claimed in claim 1, wherein the gradient field coil system is configured such that during field generation, the gradient field coil system takes parameters in relation to field gradient specifications for each individual axis of the gradient field coil system, and a homogeneity specification for the main field into account.

7. The magnetic resonance tomography system as claimed in claim 1, wherein the gradient field coil system comprises four coils for transverse gradient axes.

8. The magnetic resonance tomography system as claimed in claim 7, wherein the four coils are shielded saddle coils.

9. The magnetic resonance tomography system as claimed in claim 1, further comprising one homogeneity improvement coil or one homogeneity improvement coil per gradient axis for improving the homogeneity of the main field.

10. The magnetic resonance tomography system as claimed in claim 1, wherein field errors of the main magnetic field are compensated for by a passive iron shim.

11. The magnetic resonance tomography system as claimed in claim 1, further comprising a passive shim system mounted on a carrier structure outside of the gradient field coil system.

12. The magnetic resonance tomography system as claimed in claim 11, further comprising an insulation gap between the carrier structure of the passive shim system and the gradient field coil system.

13. The magnetic resonance tomography system as claimed in claim 12, further comprising a reflective, conductive layer provided within the insulation gap between the passive shim system and the gradient field coil system as a decoupling unit for radiant fields, stray fields, or radiant fields and stray fields.

14. The magnetic resonance tomography system as claimed in claim 13, wherein the reflective, conductive layer is made of copper sheet.

15. The magnetic resonance tomography system as claimed in claim 11, further comprising an electrical regulator of a shim iron temperature of the passive shim system.

16. The magnetic resonance tomography system as claimed in claim 11, wherein shim irons of the passive shim systems are mounted on the carrier structure outside of the gradient coil system.

17. The magnetic resonance tomography system as claimed in claim 1, wherein the gradient field coil system is operable for diffusometry, relaxometry, low-field imaging, or a combination thereof.

18. The magnetic resonance tomography system as claimed in claim 1, wherein additional shielding measures are provided for a pulsed magnetic field inside an RF chamber of the magnetic resonance tomography system.

19. The magnetic resonance tomography system as claimed in claim 18, wherein the additional shielding measures comprise electrically conductive panels on walls of the RF chamber.

20. The magnetic resonance tomography system as claimed in claim 1, wherein in an examination volume, the main field is at least approximately constant in spatial progression, and the gradient field is at least approximately increasing in spatial progression in at least one direction.

* * * * *